(12) United States Patent
Hsu et al.

(10) Patent No.: US 8,461,758 B2
(45) Date of Patent: Jun. 11, 2013

(54) BUFFER BILAYERS FOR ELECTRONIC DEVICES

(75) Inventors: Che-Hsiung Hsu, Wilmington, DE (US); Weiying Gao, Landenberg, PA (US); Shiva Prakash, Santa Barbara, CA (US)

(73) Assignee: E I Du Pont de Nemours and Company, Wilmington, DE (US)

( * ) Notice: Subject to any disclaimer, the term of this patent is extended or adjusted under 35 U.S.C. 154(b) by 554 days.

(21) Appl. No.: 12/642,093

(22) Filed: Dec. 18, 2009

(65) Prior Publication Data

US 2010/0187982 A1    Jul. 29, 2010

Related U.S. Application Data

(60) Provisional application No. 61/138,985, filed on Dec. 19, 2008.

(51) Int. Cl.
*H01L 51/52* (2006.01)
*H01L 51/50* (2006.01)

(52) U.S. Cl.
USPC .......................... 313/504; 313/506

(58) Field of Classification Search
USPC .................................. 313/498–512
See application file for complete search history.

(56) References Cited

U.S. PATENT DOCUMENTS

| | | | |
|---|---|---|---|
| 3,282,875 A * | 11/1966 | Connolly et al. ............. | 524/795 |
| 4,358,545 A | 11/1982 | Ezzell et al. | |
| 4,539,507 A | 9/1985 | VanSlyke et al. | |
| 4,795,543 A | 1/1989 | Stetter et al. | |
| 4,885,211 A | 12/1989 | Tang et al. | |
| 4,940,525 A | 7/1990 | Ezzell et al. | |
| 5,029,320 A | 7/1991 | Kido et al. | |
| 5,047,687 A | 9/1991 | VanSlyke | |
| 5,059,862 A | 10/1991 | VanSlyke et al. | |
| 5,151,629 A | 9/1992 | VanSlyke et al. | |
| 5,189,136 A | 2/1993 | Wudl | |
| 5,247,190 A | 9/1993 | Friend et al. | |
| 5,294,870 A | 3/1994 | Tang et al. | |
| 5,317,169 A | 5/1994 | Nakano et al. | |
| 5,408,109 A | 4/1995 | Heeger et al. | |
| 5,463,005 A | 10/1995 | Desmarteau | |
| 5,512,654 A | 4/1996 | Holmes et al. | |
| 5,552,678 A | 9/1996 | Tang et al. | |
| 5,626,795 A | 5/1997 | Smith et al. | |

(Continued)

FOREIGN PATENT DOCUMENTS

| | | |
|---|---|---|
| EP | 740489 A1 | 1/2000 |
| EP | 1026152 A1 | 8/2000 |

(Continued)

OTHER PUBLICATIONS

A Feiring et al, J Fluorine Chemistry 2000, 105, 129-135.

(Continued)

*Primary Examiner* — Karabi Guharay
*Assistant Examiner* — Nathaniel Lee

(57) ABSTRACT

The present invention relates to buffer bilayers, and their use in electronic devices. The bilayer has a first layer including (a) at least one electrically conductive polymer doped with at least one non-highly-fluorinated acid polymer and (b) at least one highly-fluorinated acid polymer, and a second layer including inorganic nanoparticles which are oxides or sulfides.

22 Claims, 3 Drawing Sheets

U.S. PATENT DOCUMENTS

| | | | |
|---|---|---|---|
| 5,677,572 | A | 10/1997 | Hung et al. |
| 5,723,873 | A | 3/1998 | Yang |
| 5,747,930 | A | 5/1998 | Utsugi |
| 5,776,623 | A | 7/1998 | Hung et al. |
| 5,798,170 | A | 8/1998 | Zhang et al. |
| 5,853,905 | A | 12/1998 | So et al. |
| 5,869,350 | A | 2/1999 | Heeger et al. |
| 5,981,092 | A | 11/1999 | Arai et al. |
| 6,150,426 | A | 11/2000 | Curtin et al. |
| 6,210,790 | B1 | 4/2001 | Crivello |
| 6,280,861 | B1 | 8/2001 | Hosokawa et al. |
| 6,303,238 | B1 | 10/2001 | Thompson et al. |
| 6,312,837 | B1 | 11/2001 | Kijima |
| 6,337,370 | B1 | 1/2002 | Bae et al. |
| 6,416,888 | B1 | 7/2002 | Kawamura et al. |
| 6,551,725 | B2 | 4/2003 | Raychaudhuri et al. |
| 6,670,645 | B2 | 12/2003 | Grushin et al. |
| 6,712,661 | B1 | 3/2004 | Kiguchi et al. |
| 6,828,045 | B1 | 12/2004 | Tokailin et al. |
| 6,953,705 | B2 | 10/2005 | Prakash |
| 6,963,383 | B2 | 11/2005 | Tokailin et al. |
| 7,023,013 | B2 | 4/2006 | Ricks et al. |
| 7,112,369 | B2 | 9/2006 | Wang et al. |
| 7,166,010 | B2 | 1/2007 | Lamansky et al. |
| 7,235,420 | B2 | 6/2007 | Prakash et al. |
| 7,244,797 | B2 | 7/2007 | Kurihara et al. |
| 7,270,586 | B2 | 9/2007 | Tokailin et al. |
| 8,088,499 | B1 * | 1/2012 | Wang et al. .................. 428/690 |
| 2001/0038937 | A1 | 11/2001 | Suzuki et al. |
| 2003/0020073 | A1 | 1/2003 | Long et al. |
| 2004/0102577 | A1 | 5/2004 | Hsu et al. |
| 2004/0124504 | A1 | 7/2004 | Hsu |
| 2004/0127637 | A1 | 7/2004 | Hsu et al. |
| 2005/0005850 | A1 | 1/2005 | Yamazaki |
| 2005/0023961 | A1 | 2/2005 | Pichler et al. |
| 2005/0069726 | A1 * | 3/2005 | Douglas et al. .............. 428/690 |
| 2005/0205860 | A1 | 9/2005 | Hsu et al. |
| 2005/0209392 | A1 | 9/2005 | Luo et al. |
| 2006/0033421 | A1 | 2/2006 | Matsuura et al. |
| 2006/0049410 | A1 | 3/2006 | Hosokawa et al. |
| 2006/0188745 | A1 | 8/2006 | Liao et al. |
| 2006/0189076 | A1 | 8/2006 | Nakajima |
| 2006/0234088 | A1 | 10/2006 | Inoue et al. |
| 2006/0234430 | A1 | 10/2006 | Liu et al. |
| 2006/0275926 | A1 | 12/2006 | Carcia et al. |
| 2006/0289843 | A1 | 12/2006 | Hsu et al. |
| 2006/0292362 | A1 | 12/2006 | Hsu et al. |
| 2007/0069185 | A1 * | 3/2007 | Hsu et al. ..................... 252/500 |
| 2007/0096082 | A1 | 5/2007 | Gaynor et al. |
| 2007/0170843 | A1 | 7/2007 | Kawamura et al. |
| 2007/0298530 | A1 | 12/2007 | Feehery |
| 2008/0071049 | A1 | 3/2008 | Radu et al. |
| 2008/0157654 | A1 | 7/2008 | Cok |
| 2008/0277657 | A1 | 11/2008 | Jeong et al. |

FOREIGN PATENT DOCUMENTS

| | | | |
|---|---|---|---|
| JP | 07235219 A | | 9/1995 |
| JP | 09017574 A | | 1/1997 |
| JP | 09063771 A | | 3/1997 |
| JP | 09204985 A | | 8/1997 |
| JP | 09260062 A | | 10/1997 |
| JP | 09260063 A | | 10/1997 |
| JP | 09324176 A | | 12/1997 |
| JP | 10214683 A | | 8/1998 |
| JP | 11126689 A | | 5/1999 |
| JP | 2002170666 A | | 6/2002 |
| JP | 2005259550 A | | 9/2005 |
| KR | 1020010042727 A | | 5/2001 |
| KR | 1020060135801 A | | 12/2006 |
| WO | 9810473 A1 | | 3/1998 |
| WO | 9827136 A1 | | 6/1998 |
| WO | 9831716 A1 | | 7/1998 |
| WO | 9952954 A1 | | 10/1999 |
| WO | 00/70655 A2 | | 11/2000 |
| WO | 01/41512 A1 | | 6/2001 |
| WO | 03/008424 A1 | | 1/2003 |
| WO | 03006537 A1 | | 1/2003 |
| WO | 03/040257 A1 | | 5/2003 |
| WO | 03/063555 A1 | | 7/2003 |
| WO | 03/091688 A2 | | 11/2003 |
| WO | 2004/016710 A1 | | 2/2004 |
| WO | 2004054326 A2 | | 6/2004 |
| WO | 2004105150 A1 | | 12/2004 |
| WO | 2007120143 A1 | | 10/2007 |

OTHER PUBLICATIONS

A Feiring et al, Macromolecules 2000, 33, 9262-9271.
DD Desmarteau, J Fluorine Chemistry, 1995, 72, 203-208.
AJ Appleby et al, J electrochem. Soc. 1993, 140(1), 109-111.
"Flexible light-emitting diodes made from soluble conducting polymer," Nature vol. 357, pp. 477 479 (Jun. 11, 1992).
Kirk-Othmer Encyclopedia of Chemical Technology, Fourth Edition, vol. 18, p. 837-860, 1996, by Y. Wang.
CRC Handbook of Chemistry and Physics, 81st Edition (2000-2001) (Book Not Included).
Baytron H. C. Stark GmbH (Brochure) No date.
Berggren et al., "Controlling colour by voltage in polymer light emitting diodes," Synthetic Metals, 1995, vol. 71, pp. 2185-2186.
Braun et al., "Electroluminescence and electrical transport in poly(3-thiophene) diodes," Journal of Applied Physics, 1992, vol. 72, pp. 564-568.
Braun et al., "Visible light emission from semiconducting polymer diodes," Applied Physics Letters, 1991, vol. 58, pp. 1982-1984.
Burroughs et al., "Light-emitting diodes based on conjugated polymers," Nature, 1990, vol. 347, pp. 539-541.
Greenham et al., "Efficient light-emitting diodes based on polymers with high electron affinities," Nature, 1993, vol. 365, pp. 628-630.
Grem et al., "Realization of blue-light-emitting device using poly(-p-phenylene)," Advanced Materials 1992, vol. 4, pp. 36-37.
Haas et al., "Determination of conduction band and electron affinity in surface potential measurements of BaO", Journal of Applied Physics, 1976, vol. 47, pp. 5400-5404.
Haas et al., "Electronic and chemical behavior of oxygen in BaO films on Ir(100)" Applications of Surface Science, 1977, vol. 1, pp. 59-80.
Iijima et al., "Single-Shell Carbon Nanotubles of 1-nm Diameter," Nature, 1993, vol. 363, pp. 603-605.
Ivanov et al., "The Study of Carbon Nanotubes Produced by Catalytic Method," Chemical Physics Letters, 1994, vol. 223, pp. 329-335.
Journet et al., "Large-Scale Production of Single-Walled Carbon Nanotubes by the Electric-Arc Technique," Nature, 1997, vol. 388, pp. 756-758.
Kido et al., "Single-layer white light-emitting organic electroluminescent devices based on dye-dispersed poly(N-vinylcarbazole)," Applied Physics Letters, 1995, vol. 67, No. 16, pp. 2281-2283.
Lee et al., Poly(thieno(3,4-b)thiophene) A New Stable Low Band Gap Conducting Polymer, Macromolecules, 2001, vol. 34, pp. 5746-5747.
Li et al., "Large-Scale Synthesis of Aligned Carbon Nanotubes," Science, 1996, vol. 274, pp. 1701-1703.
Parker et al., "Efficient blue electroluminescence from a fluorinated polyquinoline," Applied Physics Letters, 1994, vol. 65, No. 10, pp. 1272-1274.
Parker et al., "Fabrication of polymer light-emitting diodes using doped silicon electrodes," Applied Physics Letters, 1994, vol. 64, No. 14, pp. 1774-1776.
Parker, "Carrier tunneling and device characteristics in polymer light-emitting diodes," Journal of Applied Physics, 1994, vol. 75, No. 3, pp. 1656-1666.
Scott et al., "Degradation and Failure of MEH-PPV Light-Emitting Diodes," Journal of Applied Physics, 1996, vol. 79, No. 5, pp. 2745-2751.
Sotzing et al., "Poly(thieno(3,4-b)thiophene): A p- and n-Dopable Polythiophene Exhibiting High Optical Transparency in the Semiconducting State," Macromolecules, 2002, vol. 35, pp. 7281-7286.
Thess et al., "Crystalline Ropes of Metallic Carbon Nanotubes," Science, 1996, vol. 273, pp. 483-487.

Tumareva et al., "Field-electron spectroscopy of barium oxide films with various structures," Sov. Phys. Solid State, 1989, vol. 31, No. 2, pp. 182-185.

Wakimoto et al., "Organic electro-luminescence cells using alkaline metal compounds as electron injection materials," Trans. on Electron Devices, 1997, vol. 44, No. 8, pp. 1245-1248.

Wu et al., "Transparent, Conductive Carbon Nanotube Films," Science, 2004, vol. 305, pp. 1273-1276.

Wudl et al., "Conjugated Polymers for Organic LED's: Poly[2,5-bis(-3.alpha.-5.beta.-cholestanoxy)-phenylenevinylene] (BCHA-PPV): A Processible Yellow Light Emitter," Polymer Preprints, 1993, vol. 34, No. 1, pp. 197-198.

Yang et al., "Enhanced performance of polymer light-emitting diodes using high-surface area polyaniline network electrode," Journal of Applied Physics, 1995, vol. 77, No. 2, pp. 694-698.

Yang et al., "Polyaniline as a transparent electrode for polymer light-emitting diodes: lower operating voltage and higher efficiency," Applied Physics Letters, 1994, vol. 64, No. 10, pp. 1245-1247.

Yang et al., "Soluble blue light-emitting polymer," Macromolecules, 1993, vol. 26, pp. 1188-1190.

Yu et al., "High efficiency photonic devices made with semiconducting polymers," Synthetic Metals, 1997, vol. 85, pp. 1183-1186.

Zhang et al., "Blue electroluminescent diodes utilizing blends of poly(p-phenylphenylene vinylene) in poly(9-vinylcarbazole)," Synthetic Metals, 1994, vol. 62, pp. 35-40.

Zhang et al., "Improved efficiency in green polymer light-emitting diodes with air-stable electrodes," J. Electron. Mater., 1994, vol. 23, No. 5, pp. 453-458.

Extended European Search Report for Application No. EP 09830954.5, counterpart to U.S. Appl. No. 13/127,250; Jun. 1, 2012.

International Search Report for Application No. PCT/US1999/023775, counterpart to U.S. Appl. No. 09/173,157; EPO; Jan. 26, 2000.

International Search Report for Application No. PCT/US2009/066202, counterpart to U.S. Appl. No. 13/127,250; KIPO; Jul. 5, 2010.

* cited by examiner

BUFFER BILAYERS FOR ELECTRONIC DEVICES

RELATED APPLICATION

This application claims priority under 35 U.S.C. §119(e) from Provisional Application No. 61/138,985 filed Dec. 19, 2008 which is incorporated by reference in its entirety.

BACKGROUND INFORMATION

1. Field of the Disclosure

This disclosure relates in general to buffer bilayers and their use in electronic devices.

2. Description of the Related Art

Electronic devices define a category of products that include an active layer. Organic electronic devices have at least one organic active layer. Such devices convert electrical energy into radiation such as light emitting diodes, detect signals through electronic processes, convert radiation into electrical energy, such as photovoltaic cells, or include one or more organic semiconductor layers.

Organic light-emitting diodes (OLEDs) are an organic electronic device comprising an organic layer capable of electroluminescence. OLEDs containing conducting polymers can have the following configuration:

anode/buffer layer/EL material/cathode with additional layers between the electrodes. The anode is typically any material that has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. Electrically conducting polymers having low conductivity in the range of $10^{-3}$ to $10^{-7}$ S/cm are commonly used as the buffer layer in direct contact with an electrically conductive anode, such as ITO.

There is a continuing need for improved buffer layers.

SUMMARY

There is provided a buffer bilayer comprising:

a first layer comprising (a) at least one electrically conductive polymer doped with at least one non-highly-fluorinated acid polymer, and (b) at least one highly-fluorinated acid polymer, and a second layer in contact with the first layer, the second layer comprising inorganic nanoparticles selected from the group consisting of oxides, sulfides, and combinations thereof.

In another embodiment, the second layer is discontinuous.

In another embodiment, electronic devices comprising at least one buffer bilayer are provided.

BRIEF DESCRIPTION OF THE DRAWINGS

The invention is illustrated by way of example and not limitation in the accompanying figures.

Figure 1:
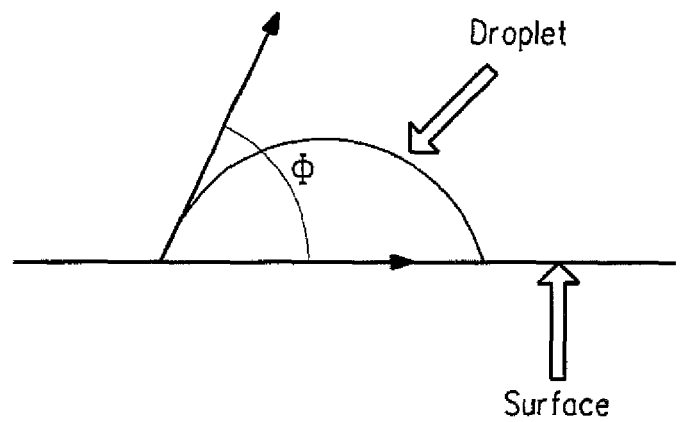
FIG. 1 is a diagram illustrating contact angle.

Skilled artisans will appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are described herein and are merely exemplary and not limiting. After reading this specification, skilled artisans will appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the First Layer of the Buffer Bilayer, the Second Layer of the Buffer Bilayer, the Formation of the Buffer Bilayer, Electronic Devices, and finally, Examples.

1. Definitions and Clarification of Terms

Before addressing details of embodiments described below, some terms are defined or clarified.

The term "buffer layer" or "buffer material" is intended to refer to electrically conductive or semiconductive layers or materials which may have one or more functions in an organic electronic device, including but not limited to, planarization of the underlying layer, charge transport and/or charge injection properties, scavenging of impurities such as oxygen or metal ions, and other aspects to facilitate or to improve the performance of an organic electronic device.

The term "conductor" and its variants are intended to refer to a layer material, member, or structure having an electrical property such that current flows through such layer material, member, or structure without a substantial drop in potential. The term is intended to include semiconductors. In some embodiments, a conductor will form a layer having a conductivity of at least $10^{-7}$ S/cm.

The term "electrically conductive" as it refers to a material, is intended to mean a material which is inherently or intrinsically capable of electrical conductivity without the addition of carbon black or conductive metal particles.

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

The term "acid polymer" refers to a polymer having acidic groups.

The term "acidic group" refers to a group capable of ionizing to donate a hydrogen ion to a Brønsted base.

The term "discontinuous" as it refers to a layer, is intended to mean a layer that does not completely cover the underlying layer in the areas in which it is applied.

The term "highly-fluorinated" refers to a compound in which at least 90% of the available hydrogens bonded to carbon have been replaced by fluorine.

The term "non-highly-fluorinated" refers to a compound in which less than 25% of the available hydrogens bonded to carbon have been replaced by fluorine. The term encompasses non-fluorinated materials.

The terms "fully-fluorinated" and "perfluorinated" are used interchangeably and refer to a compound where all of the available hydrogens bonded to carbon have been replaced by fluorine.

The term "doped" as it refers to an electrically conductive polymer, is intended to mean that the electrically conductive polymer has a polymeric counterion to balance the charge on the conductive polymer.

The term "doped conductive polymer" is intended to mean the conductive polymer and the polymeric counterion that is associated with it.

The term "layer" is used interchangeably with the term "film" and refers to a coating covering a desired area. The term is not limited by size. The area can be as large as an entire device or as small as a specific functional area such as the actual visual display, or as small as a single sub-pixel. Unless otherwise indicated, layers and films can be formed by any conventional deposition technique, including vapor deposition, liquid deposition (continuous and discontinuous techniques), and thermal transfer.

The term "nanoparticle" refers to a material having a particle size less than 100 nm. In some embodiments, the particle size is less than 10 nm. In some embodiments, the particle size is less than 5 nm.

The term "aqueous" refers to a liquid that has a significant portion of water, and in one embodiment it is at least about 40% by weight water; in some embodiments, at least about 60% by weight water.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "electron transport" means when referring to a layer, material, member or structure, such a layer, material, member or structure that promotes or facilitates migration of negative charges through such a layer, material, member or structure into another layer, material, member or structure.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

Although light-emitting materials may also have some charge transport properties, the terms "hole transport" and "electron transport" are not intended to include a layer, material, member, or structure whose primary function is light emission.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the CRC *Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. In the Formulae, the letters Q, R, T, W, X, Y, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics*, $81^{st}$ Edition (2000).

To the extent not described herein, many details regarding specific materials, processing acts, and circuits are conventional and may be found in textbooks and other sources within the organic light-emitting diode display, lighting source, photodetector, photovoltaic, and semiconductive member arts.

2. First Layer of the Buffer Bilayer

The first layer comprises (a) a conductive polymer doped with a non-highly-fluorinated acid polymer, and (b) a highly-fluorinated acid polymer. In some embodiments, the first layer consists essentially of (a) a conductive polymer doped with a non-highly-fluorinated acid polymer and (b) a highly-fluorinated acid polymer. The conductive polymer doped with a non-highly-fluorinated acid polymer will be referred to herein as the "doped conductive polymer." The layer may comprise one or more different electrically conductive polymers, one or more different non-highly-fluorinated acid polymers, and one or more different highly-fluorinated acid polymers.

The equivalent ratio of highly-fluorinated acid polymer ("HFAP") to non-highly-fluorinated acid polymer ("AP") is at least 0.2. In some embodiments, the HFAP:AP ratio is in the range of 0.2 to 2.0.

In some embodiments, the HFAP is fully fluorinated and the AP is non-fluorinated.

a. Electrically Conductive Polymer

Any electrically conductive polymer can be used in the new composition. In some embodiments, the electrically conductive polymer will form a film which has a conductivity greater than $10^{-7}$ S/cm.

The conductive polymers suitable for the new composition are made from at least one monomer which, when polymerized alone, forms an electrically conductive homopolymer. Such monomers are referred to herein as "conductive precursor monomers." Monomers which, when polymerized alone form homopolymers which are not electrically conductive, are referred to as "non-conductive precursor monomers." The conductive polymer can be a homopolymer or a copolymer. Conductive copolymers suitable for the new composition can be made from two or more conductive precursor monomers or from a combination of one or more conductive precursor monomers and one or more non-conductive precursor monomers.

In some embodiments, the conductive polymer is made from at least one precursor monomer selected from thiophenes, selenophenes, tellurophenes, pyrroles, anilines, 4-amino-indoles, 7-amino-indoles, and polycyclic aromatics. The polymers made from these monomers are referred to herein as polythiophenes, poly(selenophenes), poly(tellurophenes), polypyrroles, polyanilines, poly(4-amino-indoles), poly(7-amino-indoles), and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In some embodiments, the polycyclic aromatic polymers are poly(thienothiophenes).

In some embodiments, monomers contemplated for use to form the electrically conductive polymer in the new composition comprise Formula I below:

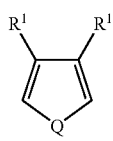

(I)

wherein:
Q is selected from the group consisting of S, Se, and Te;
R$^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both R$^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:
"alcohol"—R$^3$—OH
"amido"—R$^3$—C(O)N(R$^6$)R$^6$
"amidosulfonate"—R$^3$—C(O)N(R$^6$)R$^4$—SO$_3$Z
"benzyl"—CH$_2$—C$_6$H$_5$
"carboxylate"—R$^3$—C(O)O—Z or —R$^3$—O—C(O)—Z
"ether"—R$^3$—(O—R$^5$)$_p$—O—R$^5$
"ether carboxylate"—R$^3$—O—R$^4$—C(O)O—Z or —R$^3$—O—R$^4$—O—C(O)—Z
"ether sulfonate"—R$^3$—O—R$^4$—SO$_3$Z
"ester sulfonate"—R$^3$—O—C(O)—R$^4$—SO$_3$Z
"sulfonimide"—R$^3$—SO$_2$—NH—SO$_2$—R$^5$
"urethane"—R$^3$—O—C(O)—N(R$^6$)$_2$
where all "R" groups are the same or different at each occurrence and:
R$^3$ is a single bond or an alkylene group
R$^4$ is an alkylene group
R$^5$ is an alkyl group
R$^6$ is hydrogen or an alkyl group
p is 0 or an integer from 1 to 20
Z is H, alkali metal, alkaline earth metal, N(R$^5$)$_4$ or R$^5$
Any of the above groups may further be unsubstituted or substituted, and any group may have F substituted for one or more hydrogens, including perfluorinated groups. In some embodiments, the alkyl and alkylene groups have from 1-20 carbon atoms.

In some embodiments, in the monomer, both R$^1$ together form —W—(CY$^1$Y$^2$)$_m$—W—, where m is 2 or 3, W is O, S, Se, PO, NR$^6$, Y$^1$ is the same or different at each occurrence and is hydrogen or fluorine, and Y$^2$ is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In some embodiments, all Y are hydrogen. In some embodiments, the polymer is poly(3,4-ethylenedioxythiophene). In some embodiments, at least one Y group is not hydrogen. In some embodiments, at least one Y group is a substituent having F substituted for at least one hydrogen. In some embodiments, at least one Y group is perfluorinated.

In some embodiments, the monomer has Formula I(a):

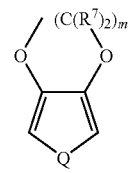

(Ia)

wherein:
Q is selected from the group consisting of S, Se, and Te;
R$^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one R$^7$ is not hydrogen, and
m is 2 or 3.

In some embodiments of Formula I(a), m is two, one R$^7$ is an alkyl group of more than 5 carbon atoms, and all other R$^7$ are hydrogen. In some embodiments of Formula I(a), at least one R$^7$ group is fluorinated. In some embodiments, at least one R$^7$ group has at least one fluorine substituent. In some embodiments, the R$^7$ group is fully fluorinated.

In some embodiments of Formula I(a), the R$^7$ substituents on the fused alicyclic ring on the monomer offer improved solubility of the monomers in water and facilitate polymerization in the presence of the fluorinated acid polymer.

In some embodiments of Formula I(a), m is 2, one R$^7$ is sulfonic acid-propylene-ether-methylene and all other R$^7$ are hydrogen. In some embodiments, m is 2, one R$^7$ is propyl-ether-ethylene and all other R$^7$ are hydrogen. In some embodiments, m is 2, one R$^7$ is methoxy and all other R$^7$ are hydrogen. In some embodiments, one $R^7$ is sulfonic acid difluoromethylene ester methylene ($-CH_2-O-C(O)-CF_2-SO_3H$), and all other $R^7$ are hydrogen.

In some embodiments, pyrrole monomers contemplated for use to form the electrically conductive polymer in the new composition comprise Formula II below.

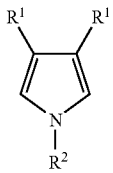

(II)

where in Formula II:
R$^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both R$^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and R$^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In some embodiments, R$^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In some embodiments, R$^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In some embodiments, the pyrrole monomer is unsubstituted and both R$^1$ and R$^2$ are hydrogen.

In some embodiments, both R$^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In some embodiments, both R$^1$ together form a 6- or 7-membered alicyclic ring, which is further substituted with an alkyl group. In some embodiments, both R$^1$ together form a 6- or 7-membered alicyclic ring, which is further substituted with an alkyl group having at least 1 carbon atom.

In some embodiments, both R$^1$ together form $-O-(CHY)_m-O-$, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In some embodiments, at least one Y group is not hydrogen. In some embodiments, at least one Y group is a substituent having F substituted for at least one hydrogen. In some embodiments, at least one Y group is perfluorinated.

In some embodiments, aniline monomers contemplated for use to form the electrically conductive polymer in the new composition comprise Formula III below.

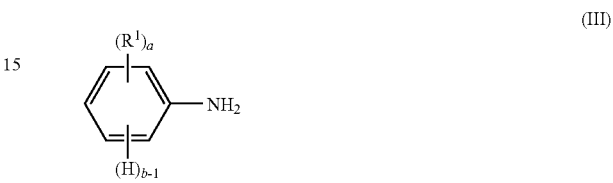

(III)

wherein:
a is 0 or an integer from 1 to 4;
b is an integer from 1 to 5, with the proviso that a+b=5; and
R$^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both R$^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

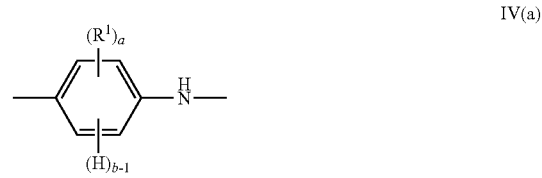

(IV(a))

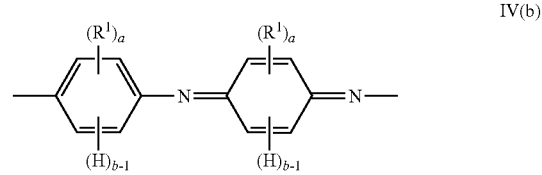

(IV(b))

where a, b and R$^1$ are as defined above.

In some embodiments, the aniline monomer is unsubstituted and a=0.

In some embodiments, a is not 0 and at least one R$^1$ is fluorinated. In some embodiments, at least one R$^1$ is perfluorinated.

In some embodiments, fused polycylic heteroaromatic monomers contemplated for use to form the electrically conductive polymer in the new composition have two or more fused aromatic rings, at least one of which is heteroaromatic. In some embodiments, the fused polycyclic heteroaromatic monomer has Formula V:

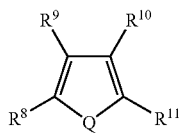

(V)

wherein:
Q is S, Se, Te, or $NR^6$;
$R^6$ is hydrogen or alkyl;
$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and
at least one of $R^8$ and $R^9$, $R^9$ and $R^{10}$, and $R^{11}$ together form an alkenylene chain completing a 5 or 6-membered aromatic ring, which ring may optionally include one or more divalent nitrogen, sulfur, selenium, tellurium, or oxygen atoms.

In some embodiments, the fused polycyclic heteroaromatic monomer has a formula selected from the group consisting of Formula V(a), V(b), V(c), V(d), V(e), V(f), V(g), V(h), V(i), V(j), and V(k):

(Va)

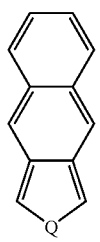

(Vb)

(Vc)

(Vd)

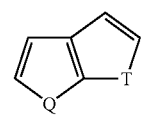

(Ve)

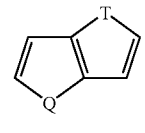

(Vf)

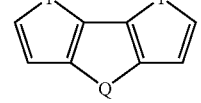

(Vg)

(Vh)

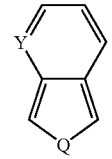

(Vi)

(Vj)

(Vk)

wherein:
Q is S, Se, Te, or NH; and
T is the same or different at each occurrence and is selected from S, $NR^6$, O, $SiR^6_2$, Se, Te, and $PR^6$;
Y is N; and
$R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, the fused polycyclic heteroaromatic monomer is a thieno(thiophene). Such compounds have been discussed in, for example, Macromolecules, 34, 5746-5747 (2001); and Macromolecules, 35, 7281-7286 (2002). In some embodiments, the thieno(thiophene) is selected from thieno(2,3-b)thiophene, thieno(3,2-b)thiophene, and thieno(3,4-b)thiophene. In some embodiments, the thieno(thiophene) monomer is further substituted with at least one group selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, polycyclic heteroaromatic monomers contemplated for use to form the polymer in the new composition comprise Formula VI:

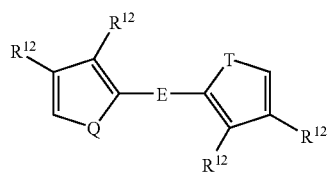

wherein:
Q is S, Se, Te, or $NR^6$;
T is selected from S, $NR^6$, O, $SiR^6_2$, Se, Te, and $PR^6$;
E is selected from alkenylene, arylene, and heteroarylene;
$R^6$ is hydrogen or alkyl;
$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In some embodiments, the electrically conductive polymer is a copolymer of a precursor monomer and at least one second monomer. Any type of second monomer can be used, so long as it does not detrimentally affect the desired properties of the copolymer. In some embodiments, the second monomer comprises no more than 50% of the polymer, based on the total number of monomer units. In some embodiments, the second monomer comprises no more than 30%, based on the total number of monomer units. In some embodiments, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In some embodiments, the copolymers are made by first forming an intermediate precursor monomer having the structure A-B-C, where A and C represent precursor monomers, which can be the same or different, and B represents a second monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In some embodiments, the electrically conductive polymer is selected from the group consisting of a polythiophene, a polypyrrole, a polymeric fused polycyclic heteroaromatic, a copolymer thereof, and combinations thereof.

In some embodiments, the electrically conductive polymer is selected from the group consisting of poly(3,4-ethylenedioxythiophene), poly(3,4-ethyleneoxythiathiophene), poly (3,4-ethylenedithiathiophene), unsubstituted polypyrrole, poly(thieno(2,3-b)thiophene), poly(thieno(3,2-b)thiophene), and poly(thieno(3,4-b)thiophene).

b. Non-Highly-Fluorinated Acid Polymer

The non-highly-fluorinated acid polymer ("AP") can be any polymer which is not highly fluorinated and has acidic groups with acidic protons. The acidic groups supply an ionizable proton. In some embodiments, the acidic proton has a pKa of less than 3. In some embodiments, the acidic proton has a pKa of less than 0. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In some embodiments, the acidic groups are selected from the group consisting of sulfonic acid groups, sulfonamide groups, and combinations thereof.

In some embodiments, the AP is water soluble. Examples of such acids include, but are not limited to, polystyrenesulfonic acid ("PSSA"), poly(2-acrylamido-2-methyl-1-propanesulfonic acid) ("PAAMPSA"), sulfonated polyacrylic acid, and sulfonated polymethacrylic acid. In some embodiments, the AP is selected from PSSA and PAAMPSA.

c. Preparation of Doped Electrically Conductive Polymer

The preparation of doped electrically conductive polymers is well known. In some embodiments, the doped electrically conductive polymer is formed by oxidative polymerization of the precursor monomer in the presence of the AP in an aqueous medium. The oxidative polymerization results in a polymer that has positive charge, and the acid anion provides the counterion for the conductive copolymer. The oxidative polymerization is carried out using an oxidizing agent such as ammonium persulfate, sodium persulfate, and mixtures thereof. The resulting product is an aqueous dispersion of the doped electrically conductive polymer.

d. Highly-Fluorinated Acid Polymer

The highly-fluorinated acid polymer ("HFAP") can be any polymer which is highly-fluorinated and has acidic groups with acidic protons. The acidic groups supply an ionizable proton. In some embodiments, the acidic proton has a pKa of less than 3. In some embodiments, the acidic proton has a pKa of less than 0. In some embodiments, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In some embodiments, the acidic groups are selected from the group consisting of sulfonic acid groups, sulfonamide groups, and combinations thereof.

In some embodiments, the HFAP is at least 95% fluorinated; in some embodiments, fully-fluorinated.

In some embodiments, the HFAP is water-soluble. In some embodiments, the HFAP is dispersible in water. In some embodiments, the HFAP is organic solvent wettable. The term "organic solvent wettable" refers to a material which, when formed into a film, possesses a contact angle no greater than 60° C. with organic solvents. In some embodiments, wettable materials form films which are wettable by phenylhexane with a contact angle no greater than 55°. The methods for measuring contact angles are well known. In some embodiments, the wettable material can be made from a polymeric acid that, by itself is non-wettable, but with selective additives it can be made wettable.

Examples of suitable polymeric backbones include, but are not limited to, polyolefins, polyacrylates, polymethacrylates, polyimides, polyamides, polyaramids, polyacrylamides, polystyrenes, and copolymers thereof, all of which are highly-fluorinated; in some embodiments, fully-fluorinated.

In one embodiment, the acidic groups are sulfonic acid groups or sulfonimide groups. A sulfonimide group has the formula:

—SO$_2$—NH—SO$_2$—R where R is an alkyl group.

In one embodiment, the acidic groups are on a fluorinated side chain. In one embodiment, the fluorinated side chains are

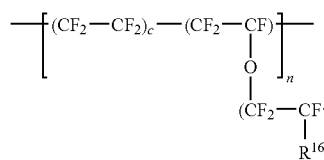

selected from alkyl groups, alkoxy groups, amido groups, ether groups, and combinations thereof, all of which are fully fluorinated.

In one embodiment, the HFAP has a highly-fluorinated olefin backbone, with pendant highly-fluorinated alkyl sulfonate, highly-fluorinated ether sulfonate, highly-fluorinated ester sulfonate, or highly-fluorinated ether sulfonimide groups. In one embodiment, the HFAP is a perfluoroolefin having perfluoro-ether-sulfonic acid side chains. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the HFAP is homopolymer or copolymer of a fluorinated and partially sulfonated poly(arylene ether sulfone). The copolymer can be a block copolymer.

In one embodiment, the HFAP is a sulfonimide polymer having Formula IX:

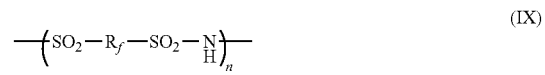

where:
R$_f$ is selected from highly-fluorinated alkylene, highly-fluorinated heteroalkylene, highly-fluorinated arylene, and highly-fluorinated heteroarylene, which may be substituted with one or more ether oxygens; and
n is at least 4.

In one embodiment of Formula IX, R$_f$ is a perfluoroalkyl group. In one embodiment, R$_f$ is a perfluorobutyl group. In one embodiment, R$_f$ contains ether oxygens. In one embodiment n is greater than 10.

In one embodiment, the HFAP comprises a highly-fluorinated polymer backbone and a side chain having Formula X:

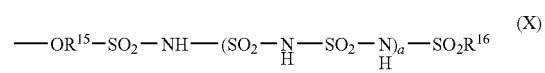

where:
R$^{15}$ is a highly-fluorinated alkylene group or a highly-fluorinated heteroalkylene group;
R$^{16}$ is a highly-fluorinated alkyl or a highly-fluorinated aryl group;
and
a is 0 or an integer from 1 to 4.

In one embodiment, the HFAP has Formula XI:

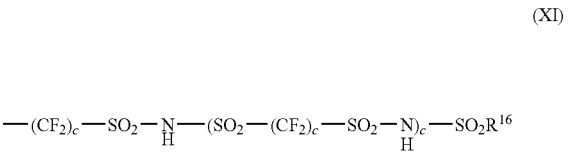

where:
R$^{16}$ is a highly-fluorinated alkyl or a highly-fluorinated aryl group;
c is independently 0 or an integer from 1 to 3; and
n is at least 4.

The synthesis of HFAPs has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the HFAP also comprises a repeat unit derived from at least one highly-fluorinated ethylenically unsaturated compound. The perfluoroolefin comprises 2 to 20 carbon atoms. Representative perfluoroolefins include, but are not limited to, tetrafluoroethylene, hexafluoropropylene, perfluoro-(2,2-dimethyl-1,3-dioxole), perfluoro-(2-methylene-4-methyl-1,3-dioxolane), CF$_2$=CFO(CF$_2$)$_t$CF=CF$_2$, where t is 1 or 2, and R$_f$"OCF=CF$_2$ wherein R$_f$" is a saturated perfluoroalkyl group of from 1 to about ten carbon atoms. In one embodiment, the comonomer is tetrafluoroethylene.

In one embodiment, the HFAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any highly-fluorinated colloid-forming polymeric material having acidic protons can be used.

Some of the polymers described hereinabove may be formed in non-acid form, e.g., as salts, esters, or sulfonyl fluorides. They will be converted to the acid form for the preparation of conductive compositions, described below.

In some embodiments, HFAP include a highly-fluorinated carbon backbone and side chains represented by the formula

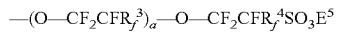

wherein $R_f^3$ and $R_f^4$ are independently selected from F, Cl or a highly-fluorinated alkyl group having 1 to 10 carbon atoms, a=0, 1 or 2, and $E^5$. In some cases $E^5$ can be a cation such as Li, Na, or K, and be converted to the acid form.

In some embodiments, the HFAP can be the polymers disclosed in U.S. Pat. No. 3,282,875 and in U.S. Pat. Nos. 4,358,545 and 4,940,525. In some embodiments, the HFAP comprises a perfluorocarbon backbone and the side chain represented by the formula

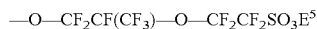

where $E^5$ is as defined above. HFAPs of this type are disclosed in U.S. Pat. No. 3,282,875 and can be made by copolymerization of tetrafluoroethylene (TFE) and the perfluorinated vinyl ether $CF_2=CF-O-CF_2CF(CF_3)-O-CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain $-O-CF_2CF_2SO_3E^5$, wherein $E^5$ is as defined above. This polymer can be made by copolymerization of tetrafluoroethylene (TFE) and the perfluorinated vinyl ether $CF_2=CF-O-CF_2CF_2SO_2F$, perfluoro(3-oxa-4-pentenesulfonyl fluoride) (POPF), followed by hydrolysis and further ion exchange as necessary.

One type of HFAP is available commercially as aqueous Nafion® dispersions, from E. I. du Pont de Nemours and Company (Wilmington, Del.).

3. Second Layer of the Buffer Bilayer

The second layer of the buffer bilayer is in direct contact with the first layer. The second layer comprises inorganic nanoparticles selected from the group consisting of oxides, sulfides, and combinations thereof. In some embodiments, the second layer consists essentially of inorganic nanoparticles selected from the group consisting of oxides, sulfides, and combinations thereof. The inorganic nanoparticles can be insulative or semiconductive. As used herein, the term nanoparticles does not include emissive materials, such as phosphors.

The second layer of the buffer bilayer can be continuous or discontinuous. When the nanoparticles are semiconductive, the layer can be continuous or discontinuous. When the nanoparticles are insulative, it is preferred that the layer be discontinuous.

In some embodiments, the nanoparticles have a size of 50 nm or less; in some embodiments, 20 nm or less. The nanoparticles can have any shape. Some examples include, but are not limited to, spherical, elongated, chains, needle-shaped, core-shell nanoparticles, and the like.

Examples of semiconductive metal oxides include, but are not limited to mixed valence metal oxides, such as zinc antimonites and indium tin oxide, and non-stoichiometric metal oxides, such as oxygen deficient molybdenum trioxide, vanadium pentoxide, and the like.

Examples of insulative metal oxides include, but are not limited to, silicon oxide, titanium oxides, zirconium oxide, molybdenum trioxide, vanadium oxide, zinc oxide, samarium oxide, yttrium oxide, cesium oxide, cupric oxide, stannic oxide, aluminum oxide, antimony oxide, and the like.

Examples of metal sulfides include cadmium sulfide, copper sulfide, lead sulfide, mercury sulfide, indium sulfide, silver sulfide, cobalt sulfide, nickel sulfide, and molybdenum sulfide. Mixed metal sulfides such as Ni/Cd sulfides, Co/Cd sulfides, Cd/In sulfides, and Pd—Co—Pd sulfides may be used.

In some embodiments, the metal nanoparticles may contain both sulfur and oxygen.

Metal oxide nanoparticles can be made by reactive sputtering of metal in the presence of oxygen, evaporation of selected oxide, and multi-component oxides, or by vapor-phase hydrolysis of inorganic compounds, for example silicon tetrachloride. It can also be produced by sol-gel chemistry using hydrolyzable metal compounds, particularly alkoxides of various elements, to react with either by hydrolysis and polycondensation to form multi-component and multi-dimensional network oxides.

Metal sulfide nanoparticles can be obtained by various chemical and physical methods. Some examples of physical methods are vapor deposition, lithographic processes and molecular beam epitaxy (MBE) of metal sulfides such as cadmium sulfide, (CdS), lead sulfide (PbS), zinc sulfide (ZnS), silver sulfide ($Ag_2S$), molybdenum sulfide ($MoS_2$) etc. Chemical methods for the preparation of metal sulfide nanoparticles are based on the reaction of metal ions in solution either with $H_2S$ gas or $Na_2S$ in aqueous medium.

In some embodiments, the nanoparticles are surface-treated with a surface modifier or coupling agent. The class of surface modifiers includes, but is not limited to, silanes, titanates, zirconates, aluminates, and polymeric dispersants. The surface modifiers contain chemical functionality, examples of which include, but are not limited to, nitrile, amino, cyano, alkyl amino, alkyl, aryl, alkenyl, alkoxy, aryloxy, sulfonic acid, acrylic acid, phosphoric acid, and alkali salts of the above acids, acrylate, sulfonates, amidosulfonate, ether, ether sulfonate, estersulfonate, alkylthio, arylthio, and the like.

In some embodiments, the surface modifiers contain crosslinking functionality, such as epoxy, alkylvinyl and arylvinyl groups. These groups can be introduced to react with the materials in adjacent layers. Examples of the surface modifiers with crosslinking groups include, but are not limited to, compounds 1-7 below.

compound 1:

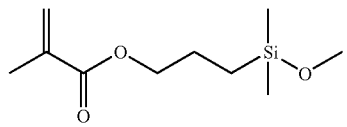

3-Methacryloxypropyldimethylmethoxy silane

-continued compound 2:

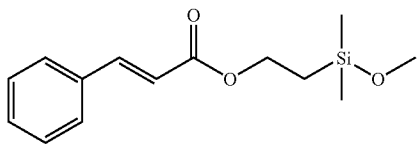

2-cinnamyloxyethyldimethylmethoxy silane compound 3:

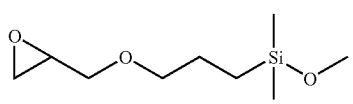

3-glycidoxypropyldimethylmethoxy silane compound 4:

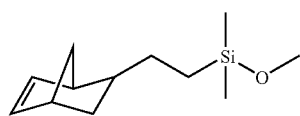

(2-bicyclo[2.2.1]hept-5-en-2-ylethyl)dimethylmethoxy silane compound 5:

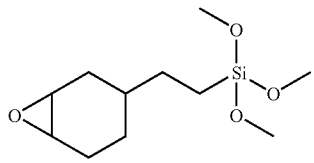

[2-(3,4-Epoxycyclohexyl)ethyl]trimethoxy silane compound 6:

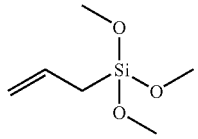

allytrimethoxy silane compound 7:

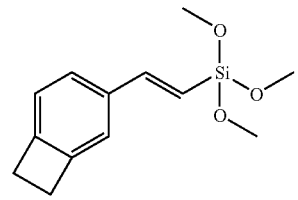

(2-bicyclo[4.2.0]octa-1,3,5-trien-3-ylethenyl)trimethoxy silane

In one embodiment, the surface modifiers are fluorinated, or pefluorinated, such as tetrafluoro-ethyltrifluoro-vinyl-ether triethoxysilane, perfluorobutane-triethoxysilane, perfluorooctyltriethoxysilane, bis(trifluoropropyl)-tetramethyl-disilazane, and bis(3-triethoxysilyl)propyl tetrasulfide.

Analogous zirconate and titanate coupling agents can also be used.

4. Formation of the Buffer Bilayer

The new buffer bilayer comprises:

a first layer comprising (a) at least one electrically conductive polymer doped with at least one non-highly-fluorinated acid polymer, and (b) at least one highly-fluorinated acid polymer, and a second layer in contact with the first layer, the second layer comprising inorganic nanoparticles selected from the group consisting of oxides, sulfides, and combinations thereof.

In some embodiments, the buffer bilayer consists essentially of the first layer and the second layer, as described above.

In the following discussion, the doped conductive polymer, HFAP, and inorganic nanoparticles will be referred to in the singular. However, it is understood that more than one of any or all of these may be used.

The buffer bilayer is formed by first forming a layer of the doped electrically conductive polymer. This is then treated to form a discontinuous second layer of the inorganic nanoparticles.

The first layer is formed by liquid deposition of an aqueous dispersion of the doped conductive polymer. The aqueous dispersion is prepared by blending the doped conductive polymer with the HFAP. This can be accomplished by adding an aqueous dispersion of the doped conductive polymer to a dispersion or solution of the HFAP. In one embodiment, the composition is further treated using sonication or microfluidization to ensure mixing of the components.

In one embodiment, one or both of the doped conductive polymer and HFAP are isolated in solid form. The solid material can be redispersed in water or in an aqueous solution or dispersion of the other component. For example, doped conductive polymer solids can be dispersed in an aqueous solution or dispersion of an HFAP.

In some embodiments, the pH of the dispersion is increased. The dispersions of doped conductive polymer remain stable from the as-formed pH of about 2, to neutral pH. The pH can be adjusted by treatment with cation exchange resins. In some embodiments, the pH is adjusted by the addition of aqueous base solution. Cations for the base can be, but are not limited to, alkali metal, alkaline earth metal, ammonium, and alkylammonium. In some embodiments, alkali metal is preferred over alkaline earth metal cations.

In some embodiments, the dispersion of the doped conductive polymer is blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers.

Any liquid deposition technique can be used, including continuous and discontinuous techniques. Continuous deposition techniques, include but are not limited to, spin coating, gravure coating, curtain coating, dip coating, slot-die coating, spray coating, and continuous nozzle printing or coating. Discontinuous deposition techniques include, but are not limited to, ink jet printing, gravure printing, and screen printing.

The first layer films thus formed are smooth and relatively transparent, and can have a conductivity in the range of $10^{-7}$ to $10^{-3}$ S/cm. The thickness of the first layer film can vary depending upon the intended use of the buffer bilayer. In some embodiments, the first layer has a thickness in the range of 10 nm to 200 nm; in some embodiments, 50 nm to 150 nm.

The second layer is then formed directly over the first layer. The methods of making the second layer include, but are not limited to, priming of oxide or sulfide nanoparticles, reactive sputtering of a metal target, thermal evaporation of metal oxide or sulfide, atomic layer deposition of organometallic precursors of metal oxides, and the like.

In some embodiments, the second layer is formed by vapor deposition.

In some embodiments, the second layer is formed by liquid deposition of a dispersion of the nanoparticles in a liquid medium. The liquid medium can be aqueous or non-aqueous. In some embodiments, the nanoparticles are present in the dispersion from 0.1 to 2.0 wt %; in some embodiments, 0.1 to 1.0 wt %; in some embodiments, 0.1 to 0.5 wt %.

In some embodiments, the second layer is thinner than the first layer. In some embodiments, the thickness of the second layer is from a molecular monolayer to 75 nm.

In some embodiments, the second layer is discontinuous. By this it is meant that the nanoparticles are evenly distributed in the areas where they are deposited, but the concentration is insufficient to completely cover the first layer. In some embodiments, the coverage is less than about 90%. In some embodiments, the coverage is less than about 50%. The coverage should be at least 20%. In some embodiments, the coverage is between 20% and 50%. When the nanoparticles are insulative, it is preferred that the second layer be discontinuous.

Buffer layers made from aqueous dispersions of doped conductive polymers and HFAPs have a very low surface energy and it is difficult to coat additional layers over them when forming a device. The buffer bilayers described herein have a higher surface energy and are more easily coated. As used herein, the term "surface energy" is the energy required to create a unit area of a surface from a material. A characteristic of surface energy is that liquid materials with a given surface energy will not wet surfaces with a sufficiently lower surface energy. One way to determine the relative surface energies, is to compare the contact angle of a given liquid on layers of different materials. As used herein, the term "contact angle" is intended to mean the angle $\Phi$ shown in FIG. 1. For a droplet of liquid medium, angle $\Phi$ is defined by the intersection of the plane of the surface and a line from the outer edge of the droplet to the surface. Furthermore, angle $\Phi$ is measured after the droplet has reached an equilibrium position on the surface after being applied, i.e. "static contact angle". Higher contact angles indicate lower surface energies. A variety of manufacturers make equipment capable of measuring contact angles.

In one embodiment, the buffer bilayer as described herein, has a contact angle with a first liquid that is at least 5° lower than the contact angle with the same liquid on the first layer alone. In some embodiments, the buffer bilayer has a contact angle with toluene of less than 50°; in some embodiments, less than 40°.

5. Electronic Devices

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electro-radiative properties. An electroactive layer material may emit radiation or exhibit a change in concentration of electron-hole pairs when receiving radiation.

Figure 2:
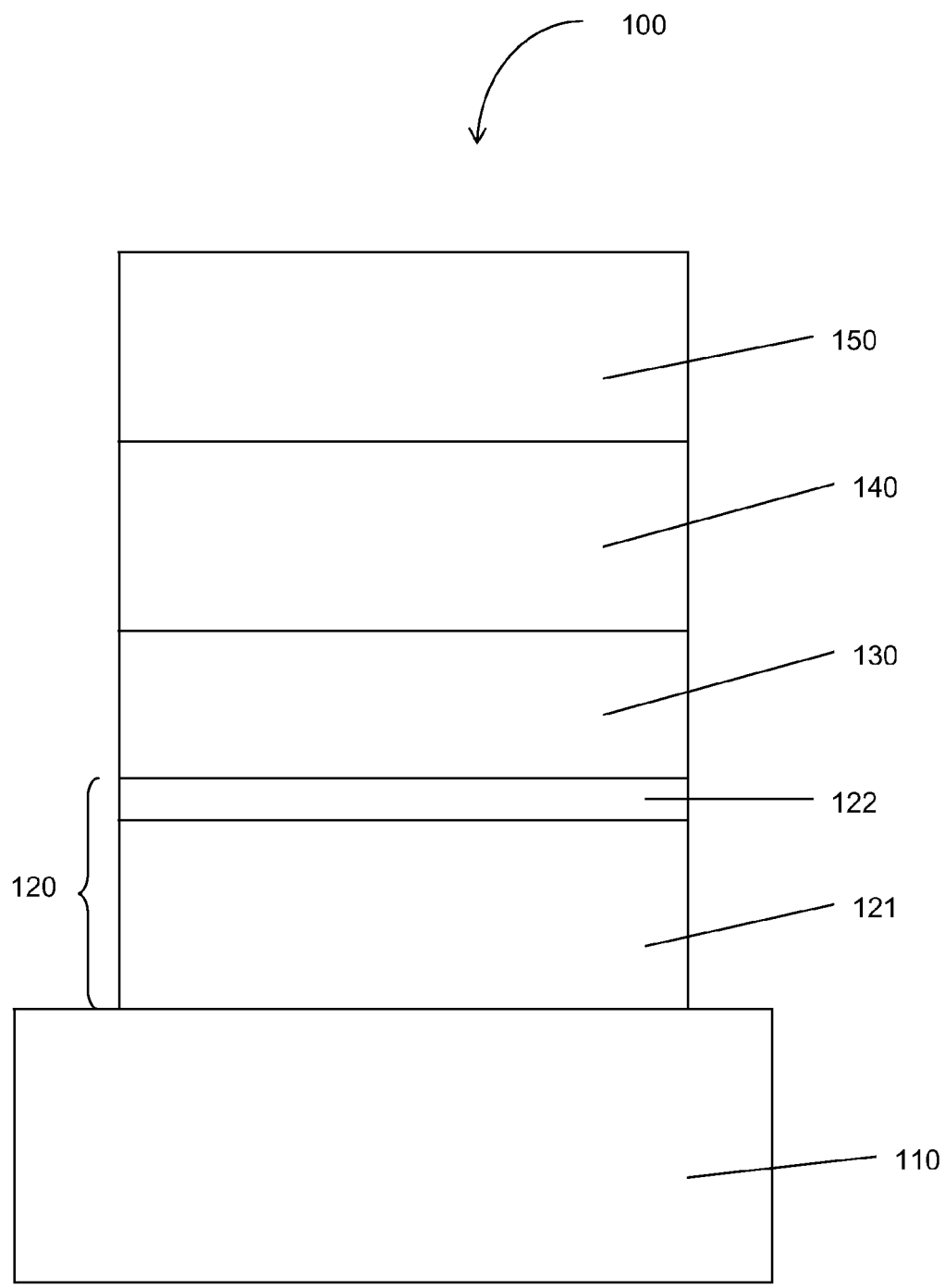
FIG. 2 is a schematic diagram of one example of an organic electronic device.

One example of a typical device is shown in FIG. 2. Device 100, has an anode layer 110, a buffer bilayer 120, an electroactive layer 130, and a cathode layer 150. Adjacent to the cathode layer 150 is an optional electron-injection/transport layer 140. The buffer bilayer has a first layer 121 and a second continuous layer 122.

Figure 3:
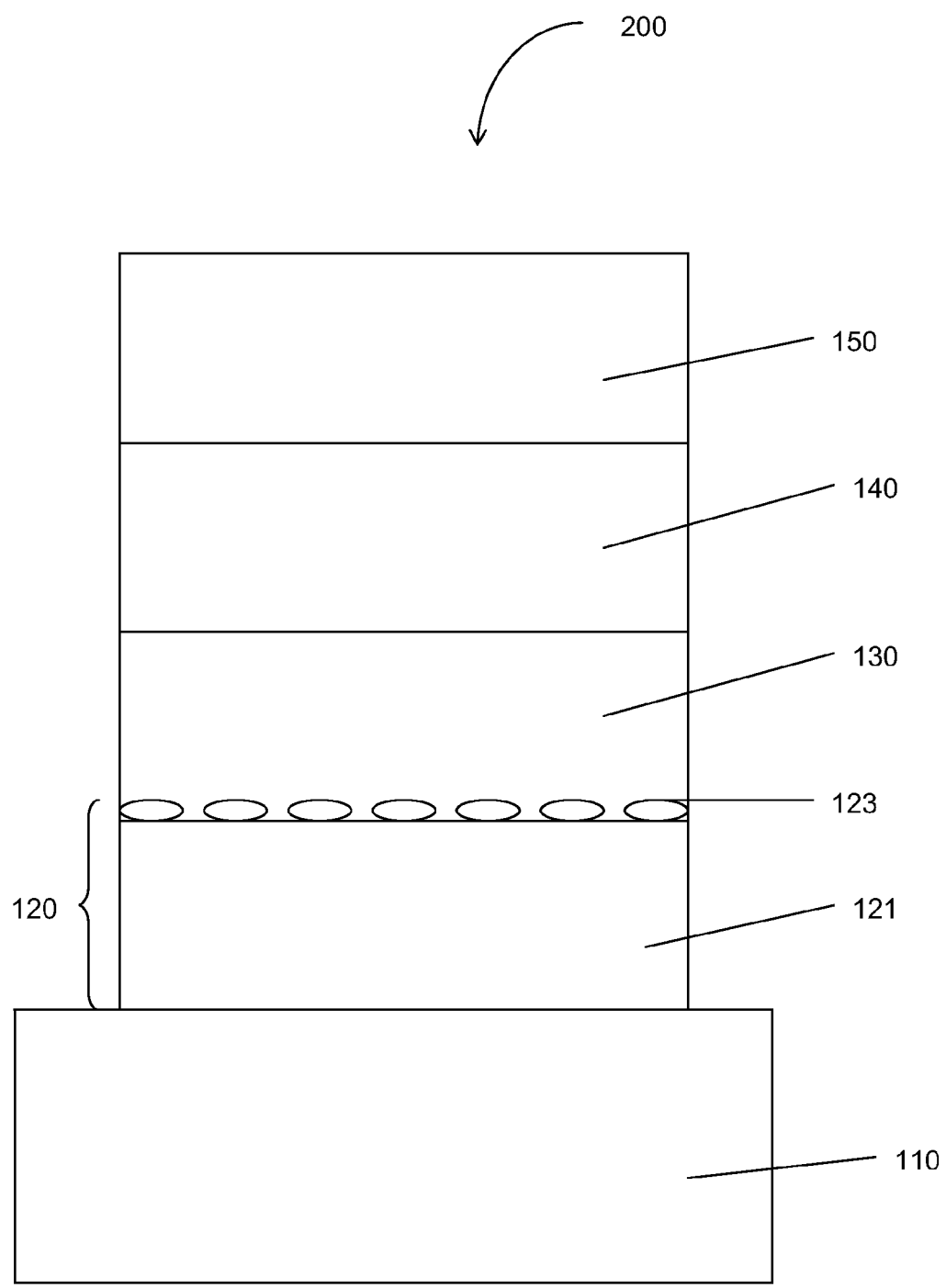
FIG. 3 is a schematic diagram of another example of an organic electronic device.

A second example of a typical device is shown in FIG. 3. Device 200, has an anode layer 110, a buffer bilayer 120, an electroactive layer 130, and a cathode layer 150. Adjacent to the cathode layer 150 is an optional electron-injection/transport layer 140. The buffer bilayer has a first layer 121 and a second discontinuous layer 123.

The device may include a support or substrate (not shown) that can be adjacent to the anode layer 110 or the cathode layer 150. Most frequently, the support is adjacent to the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 is the new bilayer described herein. In FIG. 2, the bilayer has a first layer 121 and a second continuous layer 122. In FIG. 3, the bilayer has a first layer 121 and a second discontinuous layer 123. Buffer layers made from conductive polymers doped with HFAPs, generally are not wettable by organic solvents. The buffer bilayers described herein can be more wettable and thus are more easily coated with the next layer from a non-polar organic solvent.

An optional layer, not shown, may be present between the buffer layer 120 and the electroactive layer 130. This layer may comprise hole transport materials. Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material, Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinolato)(para-phenyl-phenolato)aluminum(III) (BAlQ) and tris(8-hydroxyquinolato)aluminum (Alq$_3$); tetrakis(8-hydroxyquinolinato)zirconium; azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110 the hole transport layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; buffer layer 120, 50-2000 Å, in one embodiment 200-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

EXAMPLES

Example 1

This example illustrates preparation of a discrete bilayer of PEDOT-PSSA/HFAP [Copolymer of TFE (tetrafluoroethylene) and PSEPVE (3,6-dioxa-4-methyl-7-octenesulfonic acid)], and a mixed oxide of nano-particles, and the effect of the mixed oxide layer on the wettability of the surface.

For the bilayer:
doped conductive polymer=poly(3,4-ethylene-dioxythiophene) doped with poly(styrenesulfonic acid) ("PEDOT-PSSA") purchased as Baytron P®, from H. C. Starck (Leverkusen, Germany). The w/w ratio of PEDOT:PSSA was 1:6. The material was an aqueous dispersion having a solids wt %=1.57% and a pH=1.7.

HFAP=TFE/PSEPVE copolymer having acid equivalent (EW) of 1000. The EW means the weight in grams of the polymer per one sulfonic acid group. A 25% (w/w) Nafion® was made using a procedure similar to the procedure in U.S. Pat. No. 6,150,426, Example 1, Part 2, except that the temperature was approximately 270° C.

nanoparticles=mixed oxides. A dispersion of mixed oxide nanoparticle was purchased as ELCOM DU-1013TV from Catalysts & Chemicals Industries Co., Ltd (Kanagawa, Japan). According to the Materials Safety Data Sheet, the dispersion contains 25-35% (w/w) mixture of titanium dioxide, silicon dioxide, zirconium dioxide, and a silane coupling agent (trade secret) in a mixed dispersing liquid. The mixed dispersing media constitutes about 50-60% methyl-isobutyl-ketone (MIBK) and 10-20% methyl alcohol. Gravimetric analysis of the ELCOM DU-1013TV dispersion shows that it contains 33.7% (w/w) mixed oxides.

The HFAP dispersion was diluted with water to form a 11.08% (w/w) dispersion. 3.4814 g of this HFAP dispersion was slowly added to 10.0610 g PEDOT-PSSA. The resulting dispersion contained 4.07% solids in which the equivalent ratio of HFAP:PSSA was 0.5. The "equivalent ratio" as used herein, is intended to mean the ratio of the number of acid equivalents of HFAP to the number of acid equivalents of PSSA. The PEDOT-PSSA/HFAP dispersion was formed into a 65.5 nm film on 50 nm ITO (indium/tin oxide) surface, which was pre-treated with UV ozone for 10 minutes. The ITO purchased from Thin Film Devices Incorporated has sheet resistance of 50 ohms/square and 80% light transmission. The PEDOT-PSSA/HFAP thin film samples were then baked at 140° C. in air for 7 minutes. For Example 1, samples were top-coated with mixed oxide nanoparticles, as described below. The remaining samples were used as controls for the wettability test with toluene and for blue emission device testing.

For Example 1, a diluted mixed oxide nanoparticle dispersion of 0.24% (w/w) was made by adding 0.1544 g ELCOM DU-1013TV to 21.8346 g methylisobutyl ketone ("MiBK"). The dilute dispersion was used to spin-coat on the air-baked PEDOT-PSSA/HFAP layer at 3,000 rpm/second acceleration for 1 sec, and at the speed for one minute. This process of top-coating with the mixed oxide dispersion is also called surface-priming. The top-coated PEDOT-PSSA/Nafion® samples were then baked at 140° C. in air for 9 minutes.

Surfaces of PEDOT-PSSA/HFAP control (without priming) and Example 1 (after priming) were measured for thickness. The oxide priming only adds additional 4 nm thickness to the PEDOT-PSSA/HFAP layer. However, the mixed-oxide primed PEDOT-PSSA/HFAP surface is drastically improved in its wettability to toluene, which is the organic solvent for a hole transporting polymer used in Example 2 for fabrication of blue emitting devices. The mixed-oxide primed PEDOT-PSSA/HFAP surface is also much easier to wet with the hole-transporting polymer/toluene solution used in Example 2 than the non-primed surface. The wettability test was conducted by observing the contacts between the surfaces and toluene. Toluene droplets simply roll around the control PEDOT-PSSA/HFAP surface, whereas in Example 1, the surfaces primed with the mixed oxide allow toluene and the toluene solution to spread.

Example 2

This example illustrates the effect of bilayer buffer on device performance of a blue emitter. The PEDOT-PSSA/HFAP primed with mixed oxide nanoparticles is termed "hole-injection discrete bilayer".

In this example, the ITO/PEDOT-PSSA/HFAP control and the ITO/PEDOT-PSSA/HFAP/mixed oxide primer layer prepared in Example 1 were used. These were top-coated in an inert chamber with a dilute toluene solution of HT-1, which is an arylamine-containing copolymer having hole transport properties, to achieve 20 nm thickness after baking at 225° C. for 30 mins. After cooling, the samples were placed into a high vacuum chamber. A 32 nm thick emissive layer containing 6:1 fluorescent host: fluorescent dopant was deposited by thermal evaporation, followed sequentially by a 10 nm thick metal quinolate derivative as electron transporting layer, a 0.7 nm layer of LiF as electron injection layer, and finally 100 nm aluminum cathode layer.

The OLED samples Example 1 and the control were characterized by measuring their (1) current-voltage (I-V) curves, (2) electroluminescence radiance versus voltage, and (3) electroluminescence spectra versus voltage. All three measurements were performed at the same time and controlled by a computer. The current efficiency (cd/A) of the device at a certain voltage is determined by dividing the electroluminescence radiance of the LED by the current density needed to run the device. The blue emissive device data is shown in Table I (average of two test devices). It is evidenced that the mixed oxide interlayer shows improvement on device efficiency and lifetime besides its benefits in rendering PEDOT-PSSA/HFAP surface more wettable for ease of industrial scale processing.

TABLE I

Device Results

| Sample | Current Efficiency (cd/A) | Quantum efficiency | CIEY | V (volt) (1,000 nits) | T50(h) |
|---|---|---|---|---|---|
| Control | 7.9 | 8.3 | 0.113 | 4.2 | 1,763 @507 nits |
| Example 1 | 8.8 | 8.5 | 0.118 | 4.7 | 2,081 @535 nits |

All data @ 1000 nits unless noted;
CIEY = y color coordinate according to the C.I.E. chromaticity scale (Commision Internationale de L'Eclairage, 1931);
T50(h) = time to half luminance in hours @ 24° C.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A buffer bilayer comprising:
   a first layer consisting of (a) at least one electrically conductive polymer doped with at least one non-highly-fluorinated acid polymer, and (b) at least one highly-fluorinated acid polymer, and
   a second layer in contact with the first layer, the second layer consisting of inorganic nanoparticles selected from the group consisting of oxides, sulfides, and combinations thereof.

2. The bilayer of claim 1, wherein the second layer is discontinuous.

3. The bilayer of claim 1, wherein the inorganic nanoparticles are semiconductive and the second layer is continuous.

4. The bilayer of claim 1, wherein the electrically conductive polymer is selected from the group consisting of polythiophenes, poly(selenophenes), poly(tellurophenes), polypyrroles, polyanilines, polycyclic aromatic polymers, copolymers thereof, and combinations thereof.

5. The bilayer of claim 4, wherein the electrically conductive polymer is selected from the group consisting of a polyaniline, polythiophene, a polypyrrole, a poly(4-amino-indole), a poly(7-amino-indole), a polymeric fused polycyclic heteroaromatic, copolymers thereof, and combinations thereof.

6. The bilayer of claim 5, wherein the electrically conductive polymer is selected from the group consisting of unsubstituted polyaniline, poly(3,4-ethylenedioxythiophene), poly(3,4-ethyleneoxythiathiophene), oly(3,4-ethylenedithiathiophene), unsubstituted polypyrrole, poly(thieno(2,3-b)thiophene), poly(thieno(3,2-b)thiophene), and poly(thieno(3,4-b)thiophene).

7. The bilayer of claim 1, wherein the non-highly-fluorinated acid polymer is non-fluorinated.

8. The bilayer of claim 1, wherein the non-highly-fluorinated acid polymer is selected from the group consisting of polystyrenesulfonic acid, poly(2-acrylamido-2-methyl-1-propanesulfonic acid), sulfonated polyacrylic acid, and sulfonated polymethacrylic acid.

9. The bilayer of claim 1, wherein the highly-fluorinated acid polymer is at least 95% fluorinated.

10. The bilayer of claim 1, wherein the highly-fluorinated acid polymer is selected from a sulfonic acid and a sulfonimide.

11. The bilayer of claim 1, wherein the highly-fluorinated acid polymer is a perfluoroolefin having perfluoro-ether-sulfonic acid side chains.

12. The bilayer of claim 1, wherein the highly-fluorinated acid polymer is selected from the group consisting of a copolymer of 1,1-difluoroethylene and 2-(1,1-difluoro-2-(trifluoromethyl)allyloxy)-1,1,2,2-tetrafluoroethanesulfonic acid and a copolymer of ethylene and 2-(2-(1,2,2-trifluorovinyloxy)-1,1,2,3,3,3-hexafluoropropoxy)-1,1,2,2-tetrafluoroethanesulfonic acid.

13. The bilayer of claim 1, wherein the highly-fluorinated acid polymer is selected from a copolymer of tetrafluoroethylene and perfluoro(3,6-dioxa-4-methyl-7-octenesulfonic acid), and a copolymer of tetrafluoroethylene and perfluoro (3-oxa-4-pentenesulfonic acid).

14. The bilayer of claim 1, wherein the nanoparticles are selected from the group consisting of zinc antimonites, indium tin oxide, oxygen-deficient molybdenum trioxide, vanadium pentoxide, and combinations thereof.

15. The bilayer of claim 1, wherein the nanoparticles are selected from the group consisting of silicon oxides, titanium oxides, zirconium oxide, molybdenum trioxide, vanadium oxide, aluminum oxide, zinc oxide, samarium oxide, yttrium oxide, cesium oxide, cupric oxide, stannic oxide, aluminum oxide, antimony oxide, and combinations thereof.

16. The bilayer of claim 1, wherein the inorganic nanoparticles are selected from the group consisting of cadmium sulfide, copper sulfide, lead sulfide, mercury sulfide, indium sulfide, silver sulfide, cobalt sulfide, nickel sulfide, molybdenum sulfide, Ni/Cd sulfides, Co/Cd sulfides, Cd/In sulfides, and Pd—Co—Pd sulfides.

17. The bilayer of claim 1, wherein the nanoparticles are surface-treated with a surface modifier.

18. The bilayer of claim 17, wherein the surface modifier is selected from the group consisting of silanes, titanates, zirconates, aluminates, and polymeric dispersants.

19. The bilayer of claim 17, wherein the surface modifier has crosslinking functionality.

20. The device of claim 19, further comprising an anode, an electroactive layer, and a cathode, wherein the buffer bilayer is positioned between the anode and the electroactive layer.

21. An electronic device comprising the buffer bilayer of claim 1.

22. The device of claim 21, wherein the electroactive layer is light-emitting.

* * * * *